United States Patent [19]

De Lange

[11] Patent Number: 5,463,638
[45] Date of Patent: Oct. 31, 1995

[54] CONTROL DEVICE FOR INTERFACE CONTROL BETWEEN A TEST MACHINE AND MULTI-CHANNEL ELECTRONIC CIRCUITRY, IN PARTICULAR ACCORDING TO BOUNDARY TEST STANDARD

[75] Inventor: Willem J. De Lange, Waalre, Netherlands

[73] Assignee: JTAG Technologies B.V., Eindhoven, Netherlands

[21] Appl. No.: 46,832

[22] Filed: Apr. 13, 1993

[30] Foreign Application Priority Data

May 11, 1992 [EP] European Pat. Off. ............ 92201332.1

[51] Int. Cl.[6] .................................................. H04B 17/00
[52] U.S. Cl. .................. 371/22.3; 371/27; 371/61
[58] Field of Search ..................... 371/27, 16.1, 20.4, 371/24, 25.1, 61, 68.1, 22.3

OTHER PUBLICATIONS

IEEE Standard 1149.1–1190 "Standard Test Access Port and Boundary Scan Architecture", 21 May 1990.

Primary Examiner—Ellis B. Ramirez
Assistant Examiner—Thomas Peeso
Attorney, Agent, or Firm—Laurie E. Gathman

[57] ABSTRACT

There is disclosed a control device for interfacing between a test machine and electronic circuitry under test. The test machine generates a pattern that is composited with background data in a predetermined configuration. Each output bit is specified as either foreground or background through an indicator memory. Foreground data and background data are put at their intended positions while using a barrel shifter, decompressing means and an output multiplexer. After the test, a counterpart procedure is used for extracting exclusively relevant data at the expense of dummy data.

13 Claims, 4 Drawing Sheets

CONTROL DEVICE FOR INTERFACE CONTROL BETWEEN A TEST MACHINE AND MULTI-CHANNEL ELECTRONIC CIRCUITRY, IN PARTICULAR ACCORDING TO BOUNDARY TEST STANDARD

FIELD OF THE INVENTION

The invention relates to a control device for interface control between a test machine and electronic circuitry at a first multi-channel width, said device having foreground pattern presentation means for presenting foreground test data strings at a second multibit width. Testing of electronic circuitry is an important art and testing time of electronic circuitry would explode if no adequate measures were taken. One of such measures would be multi-channel interfacing between the test machine and the circuitry.

Now, although the invention is not limited to the particularly advantageous interface recited infra, such preferred interface for testing digital electronic circuitry has been standardized under IEEE 1140.1 under the name of Boundary Scan Test or BST; various aspects of BST have been disclosed in GB Patent Application 2,195,185, corresponding U.S. Application Ser. Nos. 07/090,489, now abandoned 07/374,515, now abandoned 07/420,612, herein incorporated by reference. BST standard features a narrow interface of four wires only, namely Test Clock TCK, Test Mode Select TMS, and furthermore Serial Data In and Serial Data Out. For greater speed, the external test interface may be executed in parallel multiple, while also, the internal test object can be distributed over these various interfaces. Now, for executing an elementary test it would often be necessary to not only provide the test data proper of foreground information, but also to initiate various other signals at appropriate background values. In a sequence of such elementary tests, the foreground data will change from one test to the other, but those background values may often remain the same. This means that for each such elementary test, both the foreground data and the background values must be entered into the circuitry.

A somewhat related problem is that often various different circuits have to be tested in sequence, that each would need their own foreground and background data at various widths and positions. The same would apply for a single circuit of which various respective parts would need to be tested so that it needs test patterns of various different lengths and composition. In consequence, a need has become felt for a test control device that had a wider interface, whereas the programmability of the foreground data versus the background data would be greatly enhanced, so that the same hardware could be used for many different target circuits or devices.

SUMMARY TO THE INVENTION

Accordingly, amongst other things, it is an object of the invention to provide such control device that is flexible, software-programmable, and fast. Now, according to a first aspect, the invention is characterized by comprising:

background data presentation means for presenting background data at a third multibit width;

indicator means for storing indicator data discriminating between foreground data and background data in a composite test pattern to be applied to said first multi-channel width;

composition means for repeatedly activating said foreground pattern presentation means and background data presentation means under control of said indicator means for thereby providing said foreground and background data at said second and third multibit widths, respectively;

positioning means for receiving compacted foreground test data and under control of said indicator data positioning foreground data and background data to mutually exclusive bit positions;

output means fed by said positioning means to output composite test data at said first multi-channel width. Through the separation between foreground presentation and background presentation the foreground data may be changed while keeping the background data fixed. Through the indicator means the composition becomes easily adaptable. Through the composition means and the output means the implementation of the programmability is hardware efficient.

Advantageously, said indicator means and said background data presentation means together constitute a topology memory means for at said third multibit width outputting data items signalling both foreground/background discrimination and if background, an appropriate bit. This allows for easier control of the composition inasmuch as indicator means and background presentation means are now co-addressed. On the other hand, in similar way the indicator means could be co-addressable with the foreground memory, but this would detract from flexibility inasmuch as various different foreground patterns may be combined with uniform indicator data.

Advantageously, said composition means have accumulating means for accumulating said data indicator signalling "foreground" modulo said second multibit width and upon generation of a carry activating a next presentation means. The accumulation of the data indicating "foreground" is easy and successive addressing of the foreground pattern presentation means is controlled in a simple manner.

Advantageously, said foreground pattern presentation means comprises memory means for storing a test data string at a maximum length of said foreground test data string. This allows for easy cycling through a test pattern. The memory may contain a single test pattern that is used for a plurality of identical circuits. The memory may contain multiple test patterns for a particular type of circuit. Various foreground data patterns may or may not share the same background and/or indicator data.

Advantageously, said foreground pattern presentation means comprises foreground pattern generating means that is parallel accessible at said second multi-bit width. Now, although the bit rate of the foreground pattern, although essentially variable, can reach a multiple of the maximum of the activation frequency, the parallellism lowers this value to a more manageable one.

Advantageously, said foreground pattern generating means comprises quasi-random pattern generating means. This is easily realizable through multiple tapping of the quasi-random generator that may contain a retrocoupled shift register. According to the foregoing, the various channels obey the generation algorithm, whether analytical or quasi-random, so that any particular channel would not deviate from the prescriptions thereof: when quasi-random, each particular channel-channel combination pair would then still be quasi-random. In contradistinction, if each channel had its private quasi-random generation, two channels could have identical informations, thereby completely destroying quasi-randomness.

The invention also relates to a device according to the foregoing for interface control between said test machine and an output side of said electronic circuitry at a fourth multi-bit width that is equal to said first multi-bit width, said device having second indicator means for storing indicator dam at a fifth multi-bit width for discriminating beteen result data and irrelevant data as appearing in a composite result pattern appearing at an output of said electronic circuitry, compression means fed by said output for under control of said second indicator means generating a compressed substring of exclusively relevant data at contiguous bit positions, and output means fed by said compression means for feeding a result bit string to said test machine at a sixth multi-bit width. At the output side, again certain bits are irrelevant and now can be ignored for result evaluation. The result pattern is rendered contiguous for minimizing data throughput requirements for the test machine.

Advantageously, said device comprises detection means fed by said second indicator means for detecting indicator data indicating the number of result data on said fifth multi-bit width; accumulator means fed by said detection means for accumulating said numbers modulo said sixth bit width as a result pointer and having a carry output; stacking means fed by said compression means and receiving said result pointer, for generating a stacked string of contiguous substrings; output means being fed by said stacking means and controleld by a carry signal at said carry output for thereupon outputting an mount of contiguous test data at said sixth bit width. In this way, compression mechanisms are used at the output side that mirror those used at the input side.

Various advantageous aspects are recited in dependent claims.

BRIEF DESCRIPTION OF THE DRAWING

The invention will be explained hereinafter with respect to a preferred embodiment that is shown in the Figures, but which is not to be taken in any way to restrict the scope of the invention, which is given solely by the appended claims. Now, the respective Figures depict successively:

DESCRIPTION OF A PREFERRED EMBODIMENT

Figure 1:
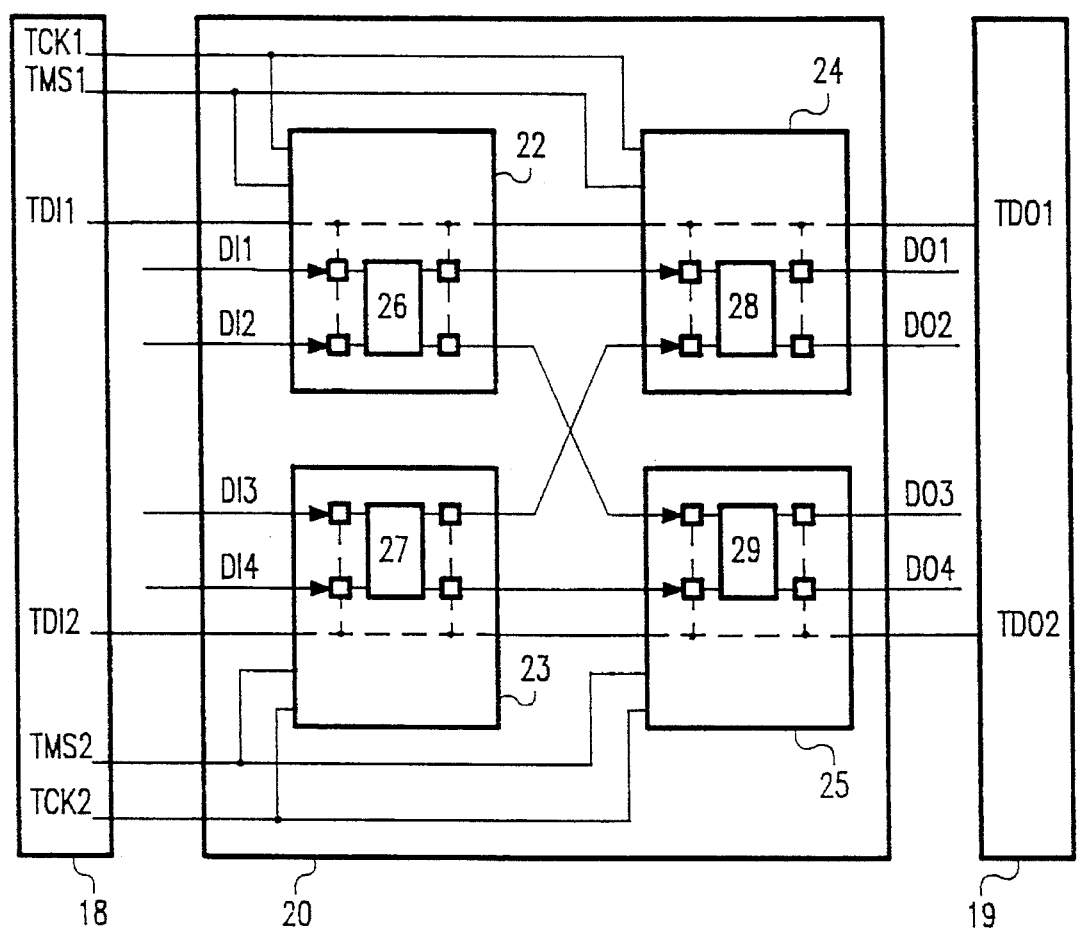
FIG. 1 an exemplary configuration for a multi-channel boundary scan test of an electronic circuitry arrangement.

FIG. 1 depicts an exemplary configuration for a multichannel boundary scan test of an electronic circuitry arrangement. First, there is a test machine made up of blocks 18, 19 which of course could be structurally unified. The device under test, board 20, contains four electronic integrated circuits 22, 23, 24, 25. There are two complete parallel BST test channels. The first channel has Test Data In TDI1, Test Data Out TDO1, Test Clock TCK1, and Test Mode Select TMS 1. Likewise, the second channel has TDI2, TDO2, TCK2 and TMS2. The standard data path has four input pins DI1..4 and four output pins TDO1..4. By itself, the processing capability and hardware layout of the device under test itself are unrelated to the features of the invention, provided that the test machine can interface to all elements of the device under test that should be interfaced. The circuits have local functionality shown as blocks 26, 27, 28, 29. As shown by small blocks, each circuit has input flip flops and output flipflops, while the four circuits have also interconnections by a data path not identified by number. Furthermore, as shown by interrupted lines, on each circuit, local test input and local test output are interconnected by a data path, which according to the boundary scan standard, IF. El::. 1149.1, also contains various registers, processing and control elements, and a bypass register, not shown in detail. Control and synchronization is furthermore provided by TCK and TMS lines but is not further discussed. Moreover, as also shown by interrupted lines, the test inputs and result outputs are interconnected with the above flipflops for therein loading test patterns and therefrom unloading result patterns as need may be. The configuration may be more complicated and/or extensive, rendering the test/result data paths ever so much wider. The blocks 22, 23, 24, 25 as shown, may constitute pan of a single integrated circuit chip, so that the chip would have plural test channels. A combination of various chips that had such different numbers of channels on a single carrier would be feasible. Now any test requires loading certain of the flipflops shown with a test pattern, operating the circuit arrangement for a short time, and finally, extracting a result pattern from certain flipflops for subsequent evaluation. The generating and composing of test patterns and the decomposing and signaturing of result patterns will be discussed hereinafter. Systems aspects of the evaluation will be ignored, however. Now, often, a subsequent test involves the same two sets of flipflops, but with a different foreground test pattern or vector. In addition to loading certain of the flipflops with a specific test pattern, it is usually also necessary to load certain other flipflops with a dummy or background pattern that by itself only serves to generate predefined initial conditions but should not influence the outcome. In many cases, a sequence of elementary tests is executed with different foreground patterns but with identical background patterns. The distribution between foreground data and background alternatively varies often between successive tests of the same circuitry arrangement, and, more particularly between the testings of respective different electronic circuitry arrangements. The invention provides a device that is fast and flexible for configuring the composite patterns of foreground vectors and background patterns according to need, in particular, with respect to a multi-channel environment as shown in FIG. 1. In principle it is possible that the total mount of test data (foreground and background combined) would be different among the channels. This could be catered for by the test machine software, for example, by filling don't care positions with dummy information.

Figure 2:
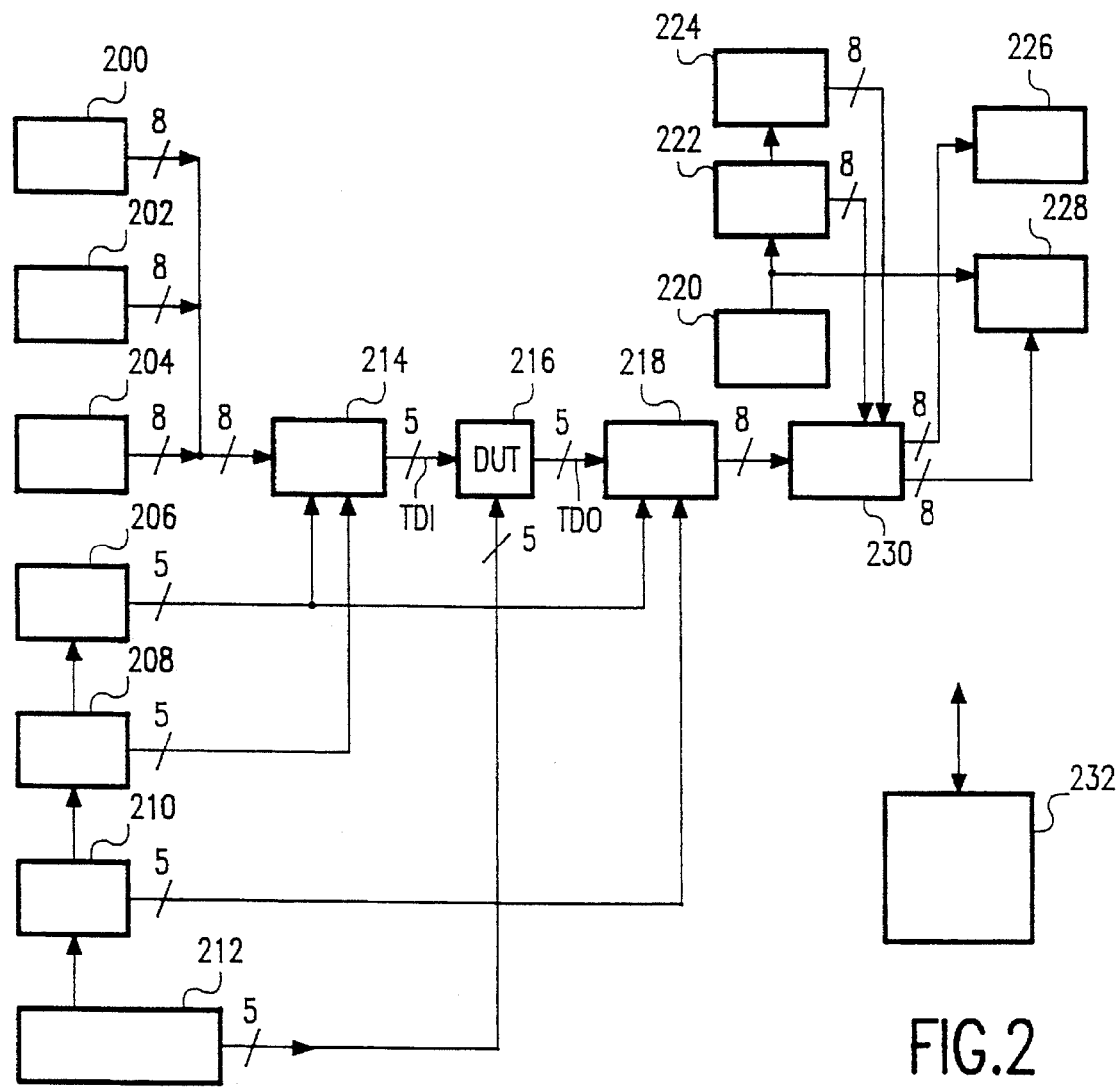
FIG. 2 an exemplary configuration for the context of the system.
Figure 3:
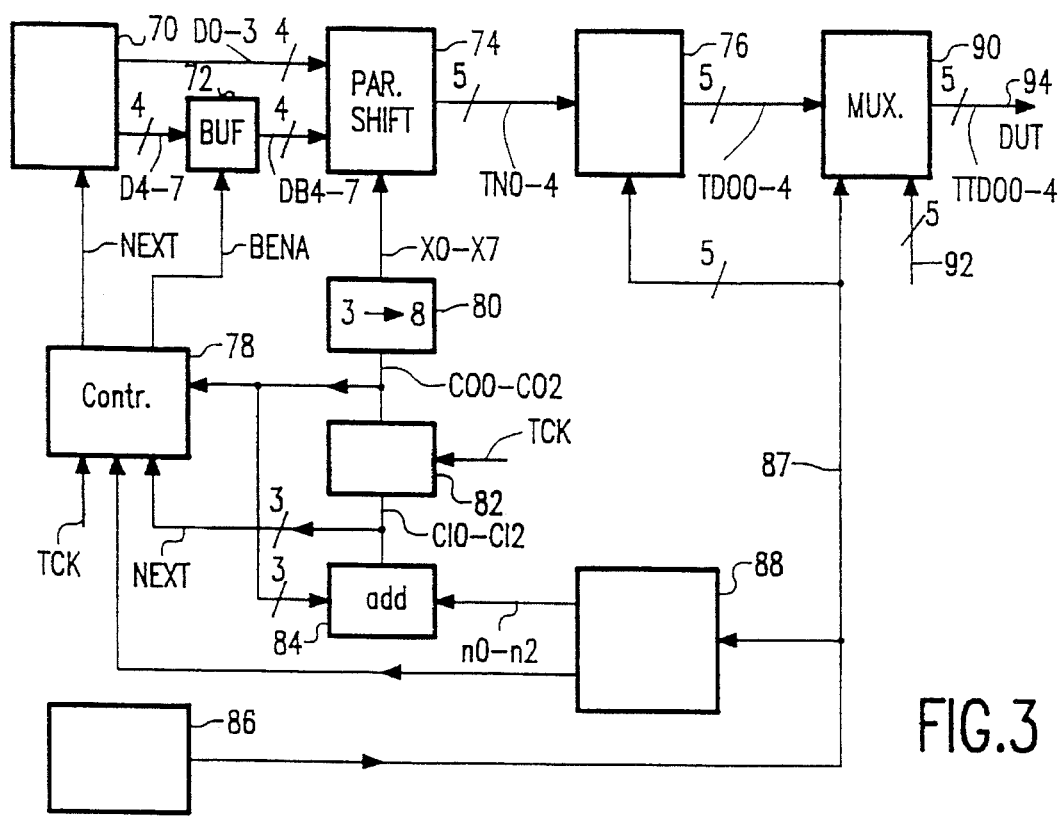
FIG. 3 an exemplary configuration of a device for generating a composite test input pattern.

FIG. 2 shows an examplary configuration for the context of the system, and comprises a device for generating a composite test input pattern, also herein referred to as a foreground/background modulator, especially so with respect to FIG. 3, and also, for demodulating the result pattern obtain from an output of the circuitry. Now, in particular, if the device under test (DUT) is connected to more than one test channel in parallel, it is important to use a single coherent mechanism for generating a foreground pattern, rather than separate mechanisms for each single channel. In particular, for arithmetical and quasi-random pattern generation it would be feasible to obviate the need for very large memories by generating the foreground vectors at the moment they are needed, by means of a suitable algorithm. In that case a coherent algorithm should be used for all channels combined, rather than separate algorithms for each particular channel. Now, the tester will be designed for a particular maximum number of parallel channels. In practice, the circuits under test will need various different numbers of such channels. However, it were difficult to design arithmetic and quasi-random pattern generators at a variable bit width. The choice according to the present invention has been to use centralized foreground pattern generation at a standard plural bit width and to use a complex converter that may convert this width to the actually used width calculated as a number of parallel channels. The test patterns as generated or stored constitute a continuous bit stream without either spaces therebetween or background signalization inserted.

A similar reasoning for the result memory and the signature generation leads to a centralised, plural channel detection, wherein a variable number of channels can be accommodated and is fed to a rather complex converter to attach the result memory and signature detection at a fixed width.

In the configuration of FIG. 2 blocks 200, 202 and 204 are test pattern sources with fixed width, here exemplary 8 bits. One of them can be chosen to feed a complex converter 214. The pseudo-random generator 200 generates a parallel 8 bits pseudo-random pattern (reference also FIG. 5). The arithmetic pattern generator, 202, generates one out of several patterns formed by a particular arithmetic rule such as all ones, all zeroes, checker board, walking ones, walking zeroes etcetera. This generator must and can be constructed such that 8 bit parallel pattens become available in a frequency not faster than TCK. No clock faster than TCK must and can be used. This property also holds for blocks 200 and 204 and is a leading aspect of this invention. The deterministic pattern memory 204 is a memory loaded in advance before the test-action proper. This block contains also an address counter so that both elements form a pattern generator. The demand of 8 bit patterns is defined by a signal NEXT generated by 204 which appears irregularly but synchroneous with TCK. The memory blocks 206, 208, 210 are addressed by an address counter being part of control block 212/ Synchroneously with TCK, control block 212 generates either TMS patterns or topology patterns. The topology patterns consist of:

indicator patterns (206) determining bit-by-bit the generation of a foreground bit from one of the foreground sources or a background bit from the background generator background patterns (208)

sense patterns (210) determining the use or loss of the DUT output patterns for result control.

The foreground/background modulator 214 is a device (reference also FIG. 3) for generating a composite test input pattern of exemplary 5 bits discussed in detail furtheron. The Device (or Board) Under Test 216 is fed by five Test Mode State patterns and five Test Device Input patterns. The corresponding five Test Device Output patterns are connected to 218. The foreground/background demodulator 218 is a device reconstructing 8 bit compact foreground-only-related patterns as discussed in more detail furtheron. Important is that the resultant pattern is 8 bit fixed width, the background is removed and no open spaces are left. The result sub-system 220, 222, 224, 226, 228, 230 allow the user to choose from several test strategies which are no further discussed here in detail. All these elements (blocks) have the important property to work in a fixed 8 bit width in parallel and with no faster clock than TCK.

FIG. 3 depicts an exemplary configuration of a device for generating a composite test input pattern. The foreground generator chosen 70 has a width of 8 bits; the output as shown is separated into two parallel four-bit or nibble channels that together constitute a bus. The lower channel has a buffer 72. The output from multiplexer 90 is five bits wide. Element 88 detects the number of ones in the foreground/background discrimination data from indicator memory 86 that is five bits wide. Element 84 is a three-bit adder to add the so detected number-of-ones to the content of accumulator register 82 that has its output retrocoupled to the other input of adder 84. As shown, register 82 receives clock signal TCK that also steps the addressing of memory 86. Therefore, this register always signals which bit position of the output from foreground memory 70 should be the next one to appear in any foreground bit position on the output of multiplexer 90. As soon as this pointer value passes the modulo-8 carry to control device 78, the latter knows to address a subsequent byte in foreground memory 70. The control device 78 also generates the signal BENA to buffer 72, which controls the loading. Upon the addressing of memory 70, the least significant bit of the five bit word on the output 94 would always come from the new byte, but the most significant bit would come from the old byte that were still partially stored in the buffer as a result from the previous memory access. As soon as the least significant bit position of the output width passes the byte edge, the buffer is loaded, so that only then the buffer stores the actually most recent byte's pan. Block 74 is a parallel or barrel shifter. Decoder 80 receives the content of register 82 and thereupon points which bit received on the parallel shifter 74 is the "next" one to forward. From this position onward, the next five bits are transmitted to decompress logic 76. Code X0 transmits data bits DB0-3, code X1 data bits DB1-4. . . code X5 data bits DB5,6,7,0 the latter one as explained already from the next byte, and so on.

Block 76 executes the decompression. It receives the five foreground bits from barrel shifter 74 and decides at what positions these should appear at output 94. Note that the bits retain their original sequence and their actual position is therefore only controlled by the positions of the background bits that are indicated on connection 87. The number of foreground bits transmitted to the output may vary between zero and five. Any non-used bit may be used for a subsequent set of five output bits. The supplementing of the background bits themselves occurs via connection 92 that come from the topology memory. This may operate together with and be structurally integrated with background memory 86. The logic of the decompression element 76 is straightforward. If the least significant channel must receive a foreground bit, the bit in question is transmitted. If the next channel must receive a foreground bit, this is the corresponding bit from element 74 if the least significant channel also received a foreground bit, or the least significant bit from element 74 if the least significant channel did not receive a foreground bit, and so on.

Figure 4:
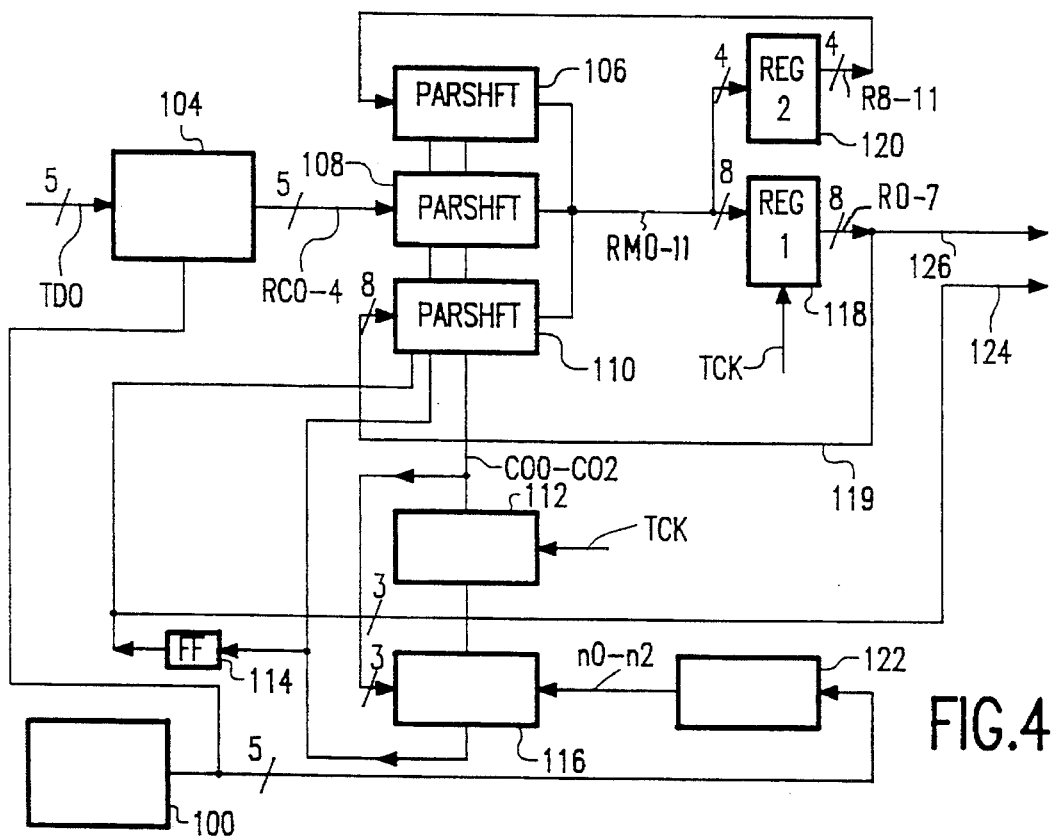
FIG. 4 an embodiment of a foreground-background demodulator.

FIG. 4 gives a likewise elaborated exemplary configuration of a fore-ground-background demodulator. Test data out at five bits wide arrive at compress block 104. Sense information is read from five bits wide sense memory 100 in synchronism with the arrival at block 104. The background bits get lost, the result data is shifted to the least significant side. The sense memory 100 may effectively be the topology memory of which indicator memory 86 and background data memory also constitute a pan. Block 104 shifts the foreground result bits zero to five in number to the least significant side of its output, so that they are in any way contiguously positioned. Block 122 detects how many result bits are relevant in the actually received bits, as opposed to dummy bits that would correspond to background data. Most often, each foreground bit gives rise to one result bit that is time shifted with respect to the foreground bit. However, this 1:1 correspondence is not absolutely necessary. The number of ones is added in adder 116 to the content of accumulator register 112, so that the content of register 112 points to the lowest significant bit position for storing the next number of effective result bits.

Furthermore, the carry output from adder 116 is stored in flipflop 114. The output pulse on line 124 signals that eight result bits are present on output 126 for further evaluation. Flipflop 114 synchronizes the carry with respect to the status register output.

Elements 106, 108, 110 are barrel shifters that allow respective independent shifts of their contents with respect to twelve bit wide output RM0-11. Their own widths are 4, 5 and 8 bits respectively. The shifts are controlled by the carry signal and the pointer value of register 112. Shifter 110 is fed by register 118 as long as register 118 is not full. Therefore, relevant filling degrees at the shifter input are 1, 2, . .7 bits aligned at the least significant side, the filling degree being indicated by the content of register 112. Shifter 106 is fed by overflow register 120. As long as register 118 is not full register 120 is empty. Whenever register 118 is full, register 120 may contain zero to four bits that are aligned at the most significant side. This means that in the next operational cycle, these bits occupy the least significant positions of RM0-11, in the same way as if they had been routed through shifter 110. The number of bits from either shifter 106 or shifter 110 (but not both, as they transmit in mutually exclusive manner) is given by the content of pointer register 112. Shifter 108 receives the new result bits. These are shifted according to the filling degree indicated by the content of pointer register 112. For example, if the pointer register indicates a filing degree of 6, the new result bits are shifted up by six positions, to subsequently occupy positions RM6 . . RM11, as far as there are indeed result bits. Finally, line 126 receives the result blocks for further processing in block 230 (FIG. 2). Line 124 transmits a take-over pulse if a byte of 8 result bits is available.

Figure 5:
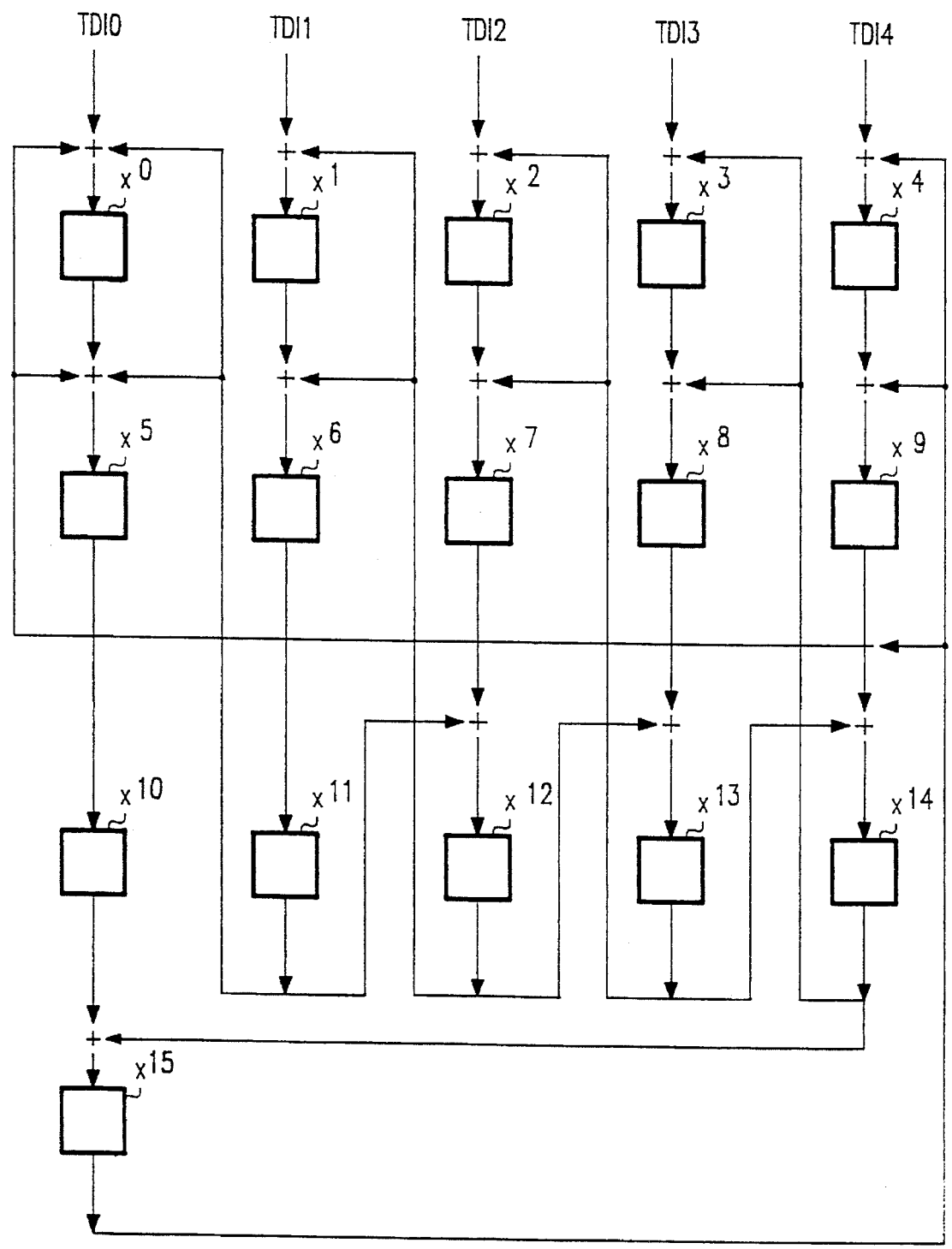
FIG. 5 a flexibly accessible retrocoupled shift register for use as a quasi-random number generator.

FIG. 5 shows a flexibility accessible retrocoupled shift register for use as a quasi-random number generator. By itself, quasi-random generation by retrocoupled shift register means is well known. The invention proposes to combine the selective multi-channel composition as recited above with a quasi-random generation that is as wide as the total pattern that is presentable at any one time. The inventor has recognized that the generator should not require extremely high frequencies. Moreover, separate generation per channel could easily cause the combination of two or more separately random number sequences have a much less random character that appropriate to the combined bit lengths of the partial patterns. It should be accessible through various bit widths for flexibility. In the example, a 16 bit pattern has been assumed, with a maximum length generator polynomial $$G(x) = x^{}16 + x^{}12 + x^{**}5 + 1.$$

In the Figure the blocks symbolize one clock pulse delay, the small +—es Exclusive ORING. For outputting a quasi-random number, any subset of the bit stages may be accessible. These outputs have not been shown. On the other hand, the shift register may be used on the output side of the device under test. With the five input bits TDI0..4 provided, the circuit generates a signature. The highest frequency required is the one at the input of block 104 in FIG. 4. Generally, the time between clock pulses is higher, first, because in FIG. 4 output 126 is wider (8 bits) than input of 104 (5 bits) and second because the background bits. The input width of FIG. 5 should be commensurate with that of channel 126. The shift register length (here 16 bits) should be adequate for rendering the probability of accidentally generating a correct signature for a faulty circuit sufficiently small. In fact, the polynomial used need not even produce a maximum length shift register.

For generating the maximum length quasi-random background pattern at the input, the shift register's length must be sufficient to produce the longest pattern required. The outputs of five arbitray flipflops should then feed the foreground/background modulator as discussed herebefore. The circuit of FIG. 5 preferably has a reset not shown.

Captions list

FIG. 2: 200: pseudo-random generator; 202: arithmetic pattern generator; 204: deterministic pattern memory; 206: indicator memory; 208: background memory; 210: sense memory; 212: control device; 214: foreground/background modulator; 216: device under test; 218: foreground/background demodulator; 220: control device; 222: expected value memory; 224: don't care value memory; 226: result signature analysis; 228: result vector memory; 230: result control; 232: control loading microprocessor. FIG. 3: 70: foreground memory; 82: pointer register; 88: decoder amount of ones; 76: decompress; 86: indicator memory.

FIG. 4: 104: compress; 112: pointer register; 122: decoder amount of ones; 100: sense memory.

I claim:

1. A control device for interface control between a test machine and electronic circuitry at a multi-channel width, said device having foreground pattern presentation means for presenting foreground test data strings at a first multi-bit width, said device being characterized by comprising:

background data presentation means for presenting background data at a second multi-bit width;

indicator means for storing indicator data discriminating between foreground data and background data in a composite test pattern to be applied to said multi-channel width;

composition means for repeatedly activating said foreground pattern presentation means and background data presentation means under control of said indicator means for thereby providing said foreground and background data at said first and second multi-bit widths, respectively;

positioning means for receiving compacted foreground test data and under control of said indicator data positioning foreground data and background data to mutually exclusive bit positions; and output means fed by said positioning means to output composite test data at said multi-channel width.

2. A control device as claimed in claim 1, wherein said indicator means and said background data presentation means together constitute a topology memory means for outputting at said second multi-bit width data items signalling both foreground/background discrimination and if background, an appropriate bit.

3. A device as claimed in claim 1 wherein said composition means have accumulating means for accumulating said data indicator signalling "foreground" modulo said first multi-bit width and upon generation of a carry activating a next presentation of said foreground pattern presentation means.

4. A device as claimed in claim 1, wherein said foreground pattern presentation means comprises memory means for storing a test data string at a maximum length of said first multi-bit width.

5. A device as claimed in claims 1 and comprising foreground pattern generating means that is parallel accessible at said first multi-bit width.

6. A device as claimed in claim 5 wherein said foreground pattern generating means comprises quasi-random pattern generating means.

7. A device as claimed in claims 1, wherein said output means that selects between a foreground data input and a background data on a bit-by-bit basis.

8. A device as claimed in claims 1, wherein said multi-channel width comprises a plurality of parallel boundary scan channels.

9. A device as claimed in claim 1, wherein said multi-channel width and said second multi-bit width are equal.

10. A control device as claimed in claim 1 for interface control between said test machine and an output of said electronic circuitry at a third multi-bit width that is equal to said multi-channel width, said device having second indicator means for storing indicator data at a fourth multi-bit width for discriminating between result data and irrelevant data as appearing in a composite result pattern appearing at said output of said electronic circuitry, compression means fed by said output of said electronic circuitry for generating under control of said second indicator means, a compressed substring of exclusively relevant data at contiguous bit positions, and output means fed by said compression means for feeding a result bit string to said test machine at a fifth multi-bit width.

11. A device as claimed in claim 10, furthermore comprising detection means fed by said second indicator means for detecting indicator data indicating the number of result data on said fourth multi-bit width; accumulator means fed by said detection means for accumulating said numbers modulo said fifth multi-bit width as a result pointer and having a carry output; stacking means fed by said compression means and receiving said result pointer, for generating a stacked string of contiguous substrings; output means being fed by said stacking means and controlled by a carry signal at said carry output for thereupon outputting an amount of contiguous test data at said fifth multi-bit width.

12. A device as claimed in claim 11 wherein said multi-channel width and said fourth multi-bit width are equal.

13. A device as claimed in claims 10, wherein said first and second indicator means together constitute a topology memory.

* * * * *